United States Patent
Wu et al.

(10) Patent No.: US 12,426,168 B2
(45) Date of Patent: Sep. 23, 2025

(54) CIRCUIT BOARD STRUCTURE AND METHOD FOR FORMING THE SAME

(71) Applicant: UNIMICRON TECHNOLOGY CORP., Taoyuan (TW)

(72) Inventors: Ming-Hao Wu, Taoyuan (TW); Chia-Ching Wang, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 169 days.

(21) Appl. No.: 18/062,739

(22) Filed: Dec. 7, 2022

(65) Prior Publication Data

US 2024/0114632 A1  Apr. 4, 2024

(30) Foreign Application Priority Data

Sep. 29, 2022  (TW) ................... 111137017

(51) Int. Cl.
*H05K 3/00* (2006.01)
*H05K 1/11* (2006.01)
*H05K 3/42* (2006.01)

(52) U.S. Cl.
CPC ............. *H05K 3/429* (2013.01); *H05K 1/115* (2013.01); *H05K 2201/09509* (2013.01); *H05K 2203/0207* (2013.01)

(58) Field of Classification Search
CPC .................. H05K 3/429; H05K 1/115; H05K 2201/09509; H05K 2203/0207
See application file for complete search history.

(56) References Cited

U.S. PATENT DOCUMENTS

| | | | |
|---|---|---|---|
| 7,337,537 B1* | 3/2008 | Smetana, Jr. | H05K 3/429 427/97.1 |
| 9,781,844 B2* | 10/2017 | Iketani | H05K 1/115 |
| 10,201,085 B2 | 2/2019 | Iketani | |
| 2007/0246252 A1* | 10/2007 | Buchwalter | H05K 3/429 29/830 |
| 2019/0159346 A1 | 5/2019 | Thomas et al. | |
| 2020/0275548 A1 | 8/2020 | Imayoshi | |

(Continued)

FOREIGN PATENT DOCUMENTS

| | | |
|---|---|---|
| CN | 101861057 A | 10/2010 |
| TW | 201626512 A | 7/2016 |

(Continued)

OTHER PUBLICATIONS

WO 2019/188344 A1; English Translation (Year: 2019).*

*Primary Examiner* — Pete T Lee
(74) *Attorney, Agent, or Firm* — Birch, Stewart, Kolasch & Birch, LLP

(57) ABSTRACT

A circuit board structure is provided. The circuit board structure includes a via hole, a conductive layer, and an alternate stacking of a plurality of circuit layers and a plurality of insulating layers. The via hole penetrates through the plurality of circuit layers and the plurality of insulating layers. The lateral ends of the plurality of insulating layers form the sidewall of the via hole. The conductive layer is conformally disposed within the via hole. The conductive layer exposes the first region of the sidewall and covers the second region of the sidewall. The sidewall extends in the longitudinal direction of the via hole and has no misalignments in the radial direction.

5 Claims, 14 Drawing Sheets

(56) References Cited

U.S. PATENT DOCUMENTS

| | | | |
|---|---|---|---|
| 2021/0307173 A1 | 9/2021 | Lenhardt et al. | |
| 2022/0015225 A1* | 1/2022 | Sinha | H01L 23/06 |
| 2022/0408553 A1* | 12/2022 | Takeuchi | H05K 3/3436 |
| 2023/0199958 A1* | 6/2023 | Trelford | H05K 3/0038 |
| | | | 174/257 |

FOREIGN PATENT DOCUMENTS

| | | | | |
|---|---|---|---|---|
| TW | 201940321 A | | 10/2019 | |
| WO | WO-2014196911 A1 | * | 12/2014 | C25D 5/02 |
| WO | WO-2019188344 A1 | * | 10/2019 | C08G 59/245 |

* cited by examiner

CIRCUIT BOARD STRUCTURE AND METHOD FOR FORMING THE SAME

CROSS REFERENCE TO RELATED APPLICATIONS

This application claims priority of Taiwan Patent Application No. 111137017 filed on Sep. 29, 2022, the entirety of which is incorporated by reference herein.

BACKGROUND

Technical Field

The present disclosure relates to circuit board structure, and in particular it relates to a circuit board structure that includes a via hole.

Description of the Related Art

Circuit boards with a multilayer circuit structure are generally fabricated using a build-up method or a laminated method, so they have a high circuit density and reduced circuit spacing. The production method of a multilayer circuit structure involves forming a build-up structure using copper foil and PrePreg. This build-up structure is repeatedly pressed and stacked on the core layer to form the multi-layer circuit structure, thereby increasing the internal wiring space in the multilayer circuit structure. The conductive material in the circuit board structure may form a conductive circuit according to the required circuit layout, and this conductive material may also be filled into a via hole in the multilayer circuit structure, to electrically connect each layer. As a result, the number of circuit structures in the multilayer circuit structure can be easily adjusted to meet requirements, and the multilayer circuit structure may be fabricated using the method described above.

Stubs in plated through holes may store capacitance. This can be avoided by removing the stubs using conventional back-drilling techniques on the circuit board structures. However, there are various difficulties and limitations associated with the aforementioned processing. For example, the diameter of the back-drilled hole must be larger than the diameter of the plated through hole, and the copper in the through hole and part of the substrate are simultaneously removed during the back-drilling process. In addition, this process requires alignment and cannot be used for circuit board structures with a high layout density.

As the hole diameter designed in the circuit board structure becomes smaller and smaller, the precision of the machine drilling tool approaches its limit. In addition, the through hole produced with current back-drilling technology still has a serious problem: through-hole clogging. This problem has not yet been overcome. To sum up, while various electronic products are developing towards high speed, high performance, and being light and compact, improving the process of manufacturing circuit board structures with high-density layout and improving the production yield are urgent problems to be solved in the field.

BRIEF SUMMARY

The present disclosure provides a circuit board structure. The circuit board structure includes an alternate stacking of a plurality of circuit layers and a plurality of insulating layers The circuit board structure also includes a via hole and a conductive layer. The via hole penetrates through the plurality of circuit layers and the plurality of insulating layers. The lateral ends of the plurality of insulating layers form the sidewall of the via hole. The conductive layer is conformally disposed within the via hole, and it exposes the first region of the sidewall and covers the second region of the sidewall. The sidewall extends in the longitudinal direction of the via hole and has no misalignments in the radial direction.

The present disclosure provides a method for forming a circuit board structure. The method includes providing a circuit board structure which includes an alternate stacking of a plurality of circuit layers and a plurality of insulating layers. The circuit board structure further includes a via hole which penetrates through the plurality of circuit layers and the plurality of insulating layers and a conductive layer conformally disposed within the via hole. The method further includes performing an electrical discharge machining step to remove a portion of the conductive layer. The sidewall of the via hole, which is formed from the lateral ends of the plurality of insulating layers, includes a first region and a second region. The first region is exposed from the remaining conductive layer. The second region is covered by the remaining conductive layer. The sidewall extends in the longitudinal direction of the via hole and has no misalignments in the radial direction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion

DETAILED DESCRIPTION

Figure 1:
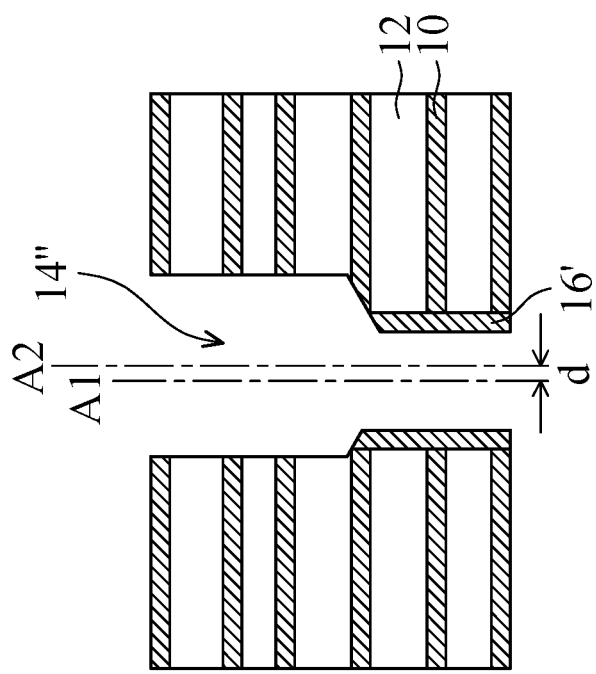
FIG. 1 illustrates a cross-sectional view of a conventional circuit board structure after performing a back-drilling step.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately", and "substantially" used herein generally refer to a given value or a range within 20 percent, preferably within 10 percent, and more preferably within 5 percent, within 3 percent, within 2 percent, within 1 percent, or within 0.5 percent. It should be noted that the amounts provided in the specification are approximate amounts, which means that even "about", "approximate", or "substantially" are not specified, the meanings of "about", "approximate", or "substantially" are still implied.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The present disclosure provides a circuit board structure and a method for forming the circuit board structure by electrical discharge machining. By locally removing the conductive layer in the via hole with an electrical discharge machining step, various advantages can be obtained while avoiding damage to the substrate. For example, when the conductive layer in the via hole is removed, the diameter of the via hole does not increase, thus facilitating the fabrication of higher density circuit layouts. By performing the electrical discharge machining steps, it is possible to form the sidewall of the via hole (formed of the lateral ends of the insulating layer in the substrate) without misalignment in the radial direction, and to remove the stubs in the via hole at any position to form conductive regions and non-conductive regions within the via hole. In addition, compared with the mechanical machining process, when removing the conductive layer in the via hole by the electrical discharge machining step, it is not needed to consider the problem of alignment deviation, and the opening of the via hole will not be clogged after the electrical discharge machining step. Therefore, through the method for forming a circuit board structure of the present disclosure, a circuit board structure with high-density layout and better yield can be manufactured.

It should be understood that the sidewall and diameter of the via hole in the present disclosure are defined by the interfaces between the lateral ends of the insulating layers in the substrate and the via hole.

FIG. 1 illustrates a cross-sectional view of a conventional circuit board structure 2 after a back-drilling step. In the alternate stacking of a plurality of circuit layers 10 and a plurality of insulating layers 12 (hereinafter also referred to as a base material), there are via holes 14" penetrating through the alternate stacking, and there is a remaining conductive layer 16' on a sidewall within the via holes 14" after the back-drilling step. In the conventional back-drilling step, in order to ensure that the conductive layer at a certain depth is completely removed on the sidewall of the via hole, the diameter of the tool used for the back-drilling step must be larger than the original diameter of the via hole. As a result, as shown in FIG. 1, after the back-drilling step, the via hole 14" has an enlarged diameter at the upper half where the conductive layer has been removed, compared to the lower half having the remaining conductive layer 16'. Since part of the substrate adjacent to the upper half of the via hole 14 is also removed, the distance between multiple via holes 14" cannot be too close. Therefore, it is difficult to form a circuit board structure with a high-density via hole layout by the conventional back-drilling step. In addition, it is difficult to form the via hole with a high aspect ratio and a small diameter by the conventional back-drilling step, because the material of the removed substrate and the conductive layer is likely to be clogged at the opening of the via holes 14" after back-drilling, resulting in poor yield of the circuit board structure 2.

In the case of performing the conventional back-drilling step, the alignment between the back-drilling tool and the via hole 14" requires special consideration. For example, in FIG. 1, axes A1 and A2 respectively represent the radial centers of the lower half and the upper half of the via hole 14" of the circuit board structure 2, and there is an offset of a distance d between them. This is because the original centers (corresponding to the axis A1) of the back-drilling tool and the via hole may not overlap in the vertical direction, and the direction of the back-drilling tool and the extending direction of the via hole (corresponding to the extending direction of the axis A1) may not be completely parallel. Since it is difficult to completely align the back-drilling tool with the via hole before back-drilling, the substrate is removed asymmetrically, which affects the yield and manufacturing precision of the resulting circuit board structure 2.

According to following discussions, the present disclosure provides an improved circuit board structure and the method for forming the same, which can result in a high-density circuit layout in the circuit board structure and improve the manufacturing yield.

Figure 2A:
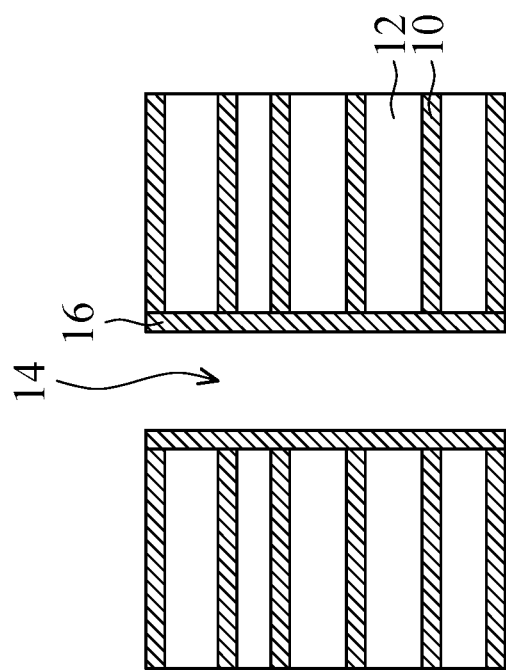
FIGS. 2A-2C illustrate cross-sectional views of various steps of a process of manufacturing a circuit board structure, in accordance with some embodiments of the present disclosure.
Figure 2B:
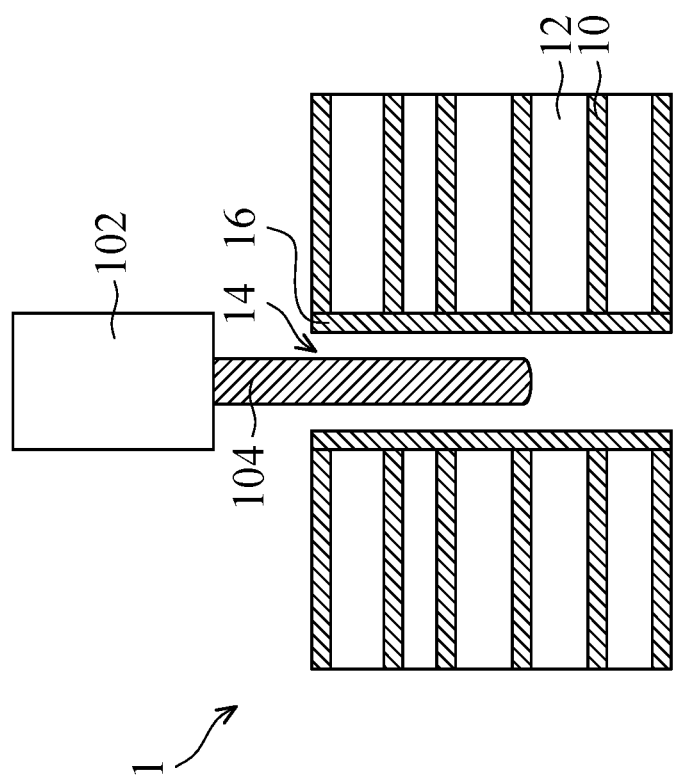
Figure 2C:
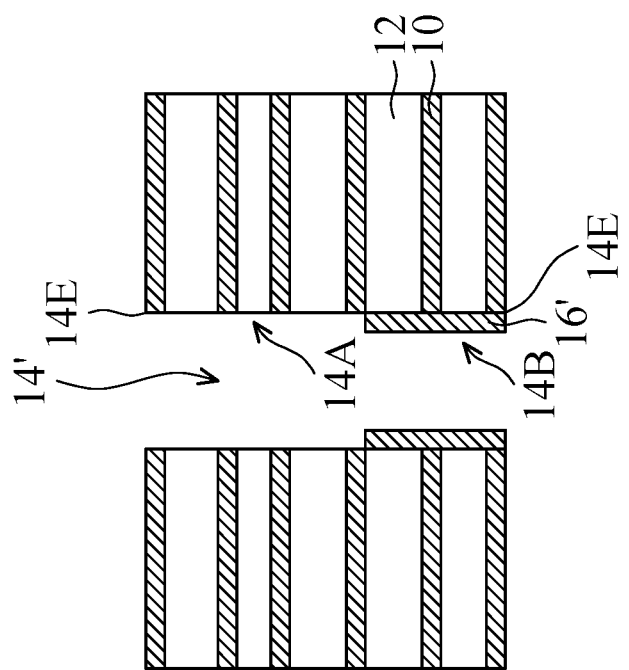

FIGS. 2A-2C are cross-sectional views illustrating various steps of a process of manufacturing a circuit board structure 1 according to some embodiments of the present disclosure. Referring to FIG. 2A, a circuit board structure 1 is provided. The circuit board structure 1 includes an alternate stacking of a plurality of circuit layers 10 and a plurality of insulating layers 12. The circuit board structure 1 further includes a via hole 14 penetrating through the plurality of circuit layers 10 and the plurality of insulating layers 12. The circuit board structure 1 further includes a conductive layer 16 disposed in the via hole 14.

Based on the consideration of electrical conductivity, the circuit layers 10 may include metal materials, such as copper, aluminum, silver, gold, another suitable material, or a combination thereof. The material of the insulating layers 12 may include dielectric materials, such as PrePreg, photo-imagable dielectric (PID), photosensitive polymer (such as Benzocyclobutene), ABF film (Ajinomoto build-up film), resin coated copper foil (RCC), glass fiber resin composite material, another suitable material, or a combination thereof. The formation method of the circuit layers 10 may include performing a deposition process such as electroplating or chemical plating on the insulating layers 12. The conductive layer 16 may be formed by materials and processes similar to those of the circuit layers 10, and the description thereof is omitted here for simplicity.

It should be noted that, although the circuit layers 10 are illustrated as continuously extending horizontally in cross-sections in FIGS. 2A-2C, in fact, each circuit layers 10 includes a pattern of conductive lines, and the conductive lines may have discontinuous segments in various cross-sections. In addition, although not illustrated in the figures, the alternate stacking of the circuit layers 10 and the insulating layers 12 may include adhesive layers for bonding the circuit layers 10 and the insulating layers 12, and the material of the adhesive layers may include, for example, PrePreg.

Referring to FIG. 2B, then an electrical discharge machining step is performed to remove a portion of the conductive layer 16. The electrical discharge machining step includes extending an electrical discharge machining electrode 104 protruded from a potential source 102 into the via hole 14, and then a portion of the conductive layer 16 is removed by electric field induction. In some embodiments, the diameter of the electrical discharge machining electrode 104 is smaller than the diameter of the via hole 14. For example, the diameter of the electrical discharge machining electrode 104 may be in the range between about 65% and about 95% of the diameter of the via hole 14.

Referring next to FIG. 2C, after the electrical discharge machining step is performed to remove a portion of the conductive layer 16, the sidewall of the via hole 14' includes a first region 14A (also referred to as the non-conductive region) exposed from the remaining conductive layer 16') and a second region 14B (also referred to as the conductive region) covered by the remaining conductive layer 16'. In addition, the sidewall of the via hole 14' remains free of misalignment in the radial direction after the electrical discharge machining step.

As shown in FIGS. 2B and 2C, in the electrical discharge machining step, the depth of the electrical discharge machining electrode 104 extending in the via hole 14 corresponds to the boundary between the portion with the remaining conductive layer 16' and the portion where the conductive layer 16 is removed. Therefore, by adjusting the depth to which the electrical discharge machining electrode 104 extends, the conductive layer 16 in the via hole 14 can be removed at any depth to form the conductive region and the non-conductive region within the via hole 14'. In some embodiments, the diameter of the via hole 14 is the same before and after the electrical discharge machining step. That is, the positions of the lateral ends of the insulating layers 12 around the via hole 14 is the same before and after the electrical discharge machining step.

In the circuit board structure 1 after the electrical discharge machining step is performed, as shown in FIG. 2C, the first region 14A and the second region 14B may be alternately disposed along the longitudinal direction of the via hole 14. In some embodiments, a portion of the second region 14B is adjacent to an edge 14E between the via hole 14' and the outer surface of the aforementioned alternate stacking. In some embodiments, the sidewall of the via hole 14' (surfaces of the lateral ends of the insulating layers 12 adjacent to the via hole 14') has the same diameter in the first region 14A and the second region 14B. In some embodiments, the remaining conductive layer 16' is electrically connected to at least some of the circuit layer 10. In some embodiments, a portion of the circuit layers 10 are exposed at the first region 14A of the sidewall of the via hole 14'.

In some embodiments, the duration that the electrical discharge machining electrode 104 applies the voltage may be controlled to remove a portion of the conductive layer 16 without removing the circuit layers 10 adjacent to the via hole 14. Since the electrical discharge machining step only removes the conductive layer 16 and not the insulating layers 12, it is not necessary to strictly control the alignment between the electrical discharge machining electrode 104 and the via hole 14, and the diameter of the via hole of the circuit board structure 1 is not changed after performing the electrical discharge machining step, which facilitates the fabrication of circuit layouts with high density. Furthermore, in some embodiments, since the electrical discharge machining step is performed in the electrolyte, the components of the removed conductive material will flow away with the electrolyte and will not clog the opening of the via hole 14.

In summary, by using an electrical discharge machining step to remove a portion of the conductive layer 16 in the via hole 14, a circuit board structure with a high-density layout and better yield can be manufactured.

Figure 3A:
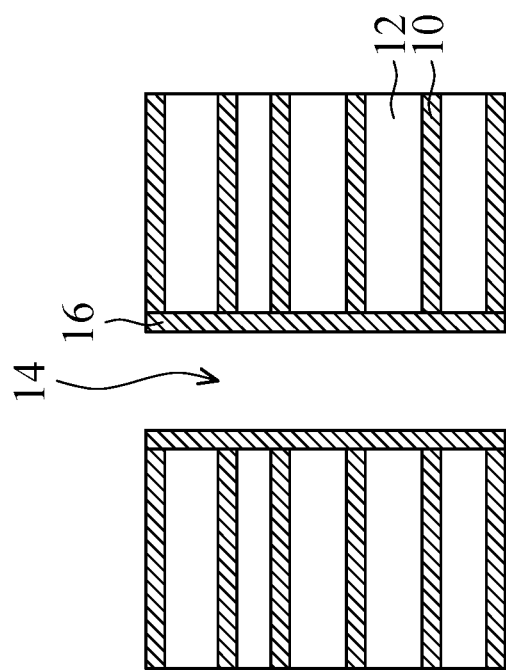
FIGS. 3A-3C illustrate cross-sectional views of various steps of a process of manufacturing a circuit board structure, in accordance with some embodiments of the present disclosure.
Figure 3B:
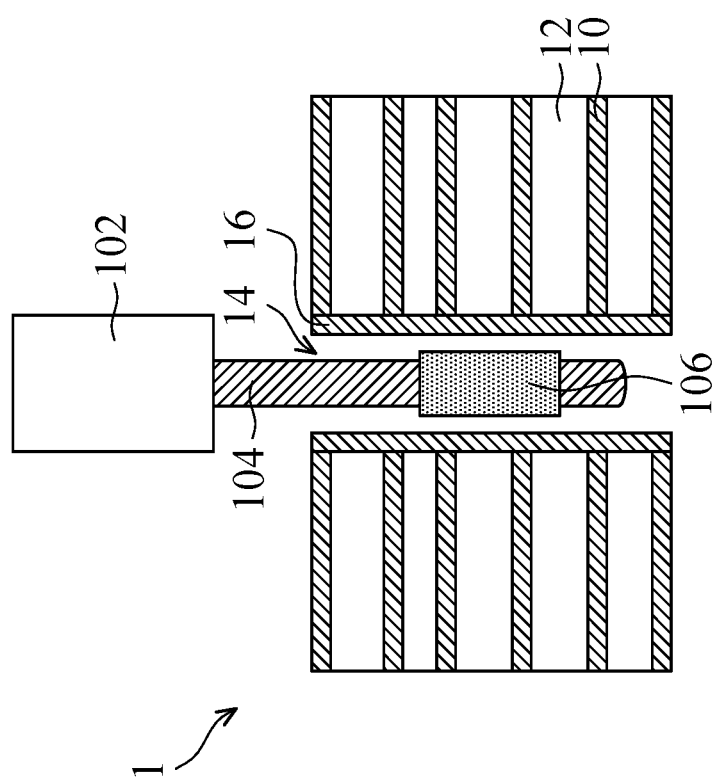
Figure 3C:
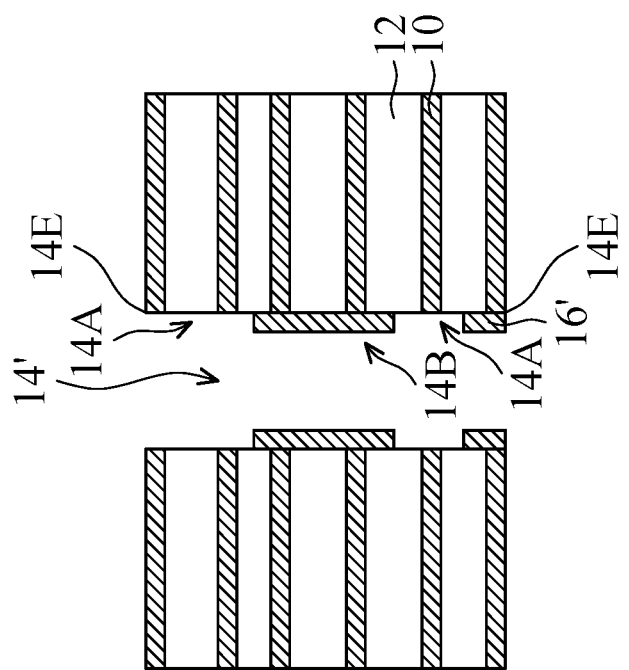

FIGS. 3A-3C illustrate cross-sectional views of various steps of a process of manufacturing the circuit board structure 1, in accordance with some embodiments of the present disclosure. Referring to FIG. 3A, at first, a circuit board structure similar to the circuit board structure 1 in FIG. 2A is provided. In this embodiment, the materials and the forming methods of the circuit layers 10, the insulating layers 12 and the conductive layer 16 are similar to those discussed above, and their descriptions are omitted here for simplicity.

Referring to FIG. 3B, an electrical discharge machining step is then performed to remove a portion of the conductive layer 16. The electrical discharge machining step includes extending an electrical discharge machining electrode 104 into the via hole 14 and then removing a portion of conductive layer 16 by electric field induction. The difference from the above embodiments is that a section of the electrical discharge machining electrode 104 is covered by an insulating material 106, and this section corresponds to the portion of the conductive layer 16 that has not been removed in the longitudinal direction of the via hole 14 (such as the remaining conductive layer 16' on the second region 14B in FIG. 3C). In some embodiments, the diameter of the outer surface of the insulating material 106 is smaller than the diameter of the via hole 14. For example, the diameter of the outer surface of insulating material 106 may range between about 65% and about 95% of the diameter of the via hole 14. The material of the insulating material 106 may include silicone resin, inorganic filler, high temperature insulating paint, tungsten, molybdenum metal, another suitable material, or a combination thereof.

Referring next to FIG. 3C, after an electrical discharge machining step is performed to remove the portion of the conductive layer 16, the sidewall of the via hole 14 includes the first region 14A exposed from the remaining conductive layer 16' and the second area 14B covered by the remaining conductive layer 16'. In addition, the sidewall of the via hole 14 remains free of misalignment in the radial direction after the electrical discharge machining step.

As shown in FIGS. 3B and 3C, in the electrical discharge machining step, the depth of the electrical discharge machining electrode 104 extending in the via hole 14 corresponds to one of the boundaries of the first region 14A and the second region 14B. Therefore, by adjusting the depth to which the electrical discharge machining electrode 104 extends, the conductive layer in the via hole 14 can be removed to any depth to form a conductive region and a non-conductive region within the via hole. In some embodiments, the diameter of the via hole 14 is the same before and after the electrical discharge machining step. That is, the positions of the lateral ends of the insulating layers 12 around the via hole 14 is the same before and after the electrical discharge machining step.

In addition, since the insulating material 106 may mask a portion of the electrical discharge machining electrode 104, the portion of the conductive layer 16 corresponding to the position of the insulating material 106 in the longitudinal direction of the via hole 14 remains in the via hole 14. Thereby, the remaining conductive layer 16' covering the second region 14B (non-conductive region) is formed.

In the circuit board structure 1 after the electrical discharge machining step is performed, as shown in FIG. 3C, the first regions 14A and the second regions 14B may be alternately disposed along the longitudinal direction of the via hole 14. In some embodiments, a portion of the second region 14B is adjacent to the edge 14E between the via hole 14 and the outer surface of the aforementioned alternate stacking. In some embodiments, the sidewall of the via hole 14 has the same diameter in the first region 14A and the second region 14B. In some embodiments, the remaining conductive layer 16' is electrically connected to at least some of the circuit layer 10. In some embodiments, a portion of the circuit layer 10 is exposed in the first region 14A of the sidewall of the via hole 14.

In some embodiments, the duration that the electrical discharge machining electrode 104 applies the voltage may be controlled to remove a portion of the conductive layer 16 without removing the circuit layer 10 adjacent to the via hole 14. Since the electrical discharge machining step only removes the conductive layer 16 and not the insulating layers 12, it is not necessary to strictly control the alignment between the electrical discharge machining electrode 104 and the via hole 14, and the diameter of the via hole 14 of the circuit board structure 1 is not changed after the electrical discharge machining step, which facilitates the fabrication of higher density circuit layouts.

Furthermore, in some embodiments, since the electrical discharge machining step is performed in the electrolyte, the components of the removed conductive material will flow away with the electrolyte and will not clog the opening of the via hole 14. In summary, by using the electrical discharge machining step to remove a portion of the conductive layer 16 in the via hole 14, a circuit board structure with a high-density layout and better yield can be fabricated.

In addition, in embodiments where the insulating material 106 is used to wrap a section of the electrical discharge machining electrode 104, the position within the via hole 14 where the conductive layer 16 is removed can be controlled more freely. As shown in FIG. 3C, in some embodiments, a portion of the first region 14A is sandwiched within the second region 14B. This is a structure that cannot be fabricated with the conventional via hole 14 formed by the back-drilling technique. Even if two alternate stackings of the circuit layers 10 and the insulating layers 12 are back-drilled and then bonded to form a via structure in which the non-conductive region is sandwiched within the conductive region, the resulting via hole may have a sidewall with a misalignment in the radial direction, since the via holes in the two alternate stackings would have an unavoidable offset when they are bonded together. In addition, the adhesive in the aforementioned lamination process will diffuse into the resulting via hole, which is difficult to remove when the diameter of the via hole is small, and will cover the conductive area in the via hole, affecting the yield of the circuit board structure.

Furthermore, referring to FIG. 3C, a portion of the second region 14B may be sandwiched within the first region 14A. Even if two back-drilling steps are respectively performed on both sides of the alternate stacking of the circuit layers 10 and the insulating layers 12 to form such a structure, it is difficult to completely align the back-drilling steps performed on both sides of the alternate stacking, so the resulting via hole cannot have a sidewall without misalignment in the radial direction. In addition, performing the back-drilling step for multiple times will result in more severe via hole clogging, affecting the yield of the circuit board structure.

FIGS. 4A-4D illustrate cross-sectional views of the circuit board structure 1, in accordance with some other embodiments of the present disclosure.

Figure 4A:
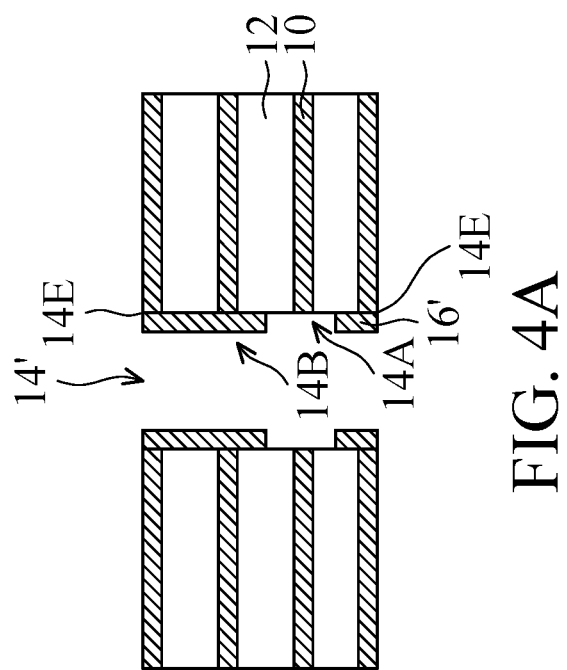
FIGS. 4A-4D illustrate cross-sectional views of a circuit board structure, in accordance with some other embodiments of the present disclosure.

Referring to FIG. 4A, in some embodiments, by adjusting the position of the insulating material 106, the first region 14A of the vie hole 14' may be sandwiched within the second region 14B. In addition, a portion of the second region 14B is adjacent to the edge 14E between the via hole 14' and the outer surface of the alternate stacking.

Figure 4B:
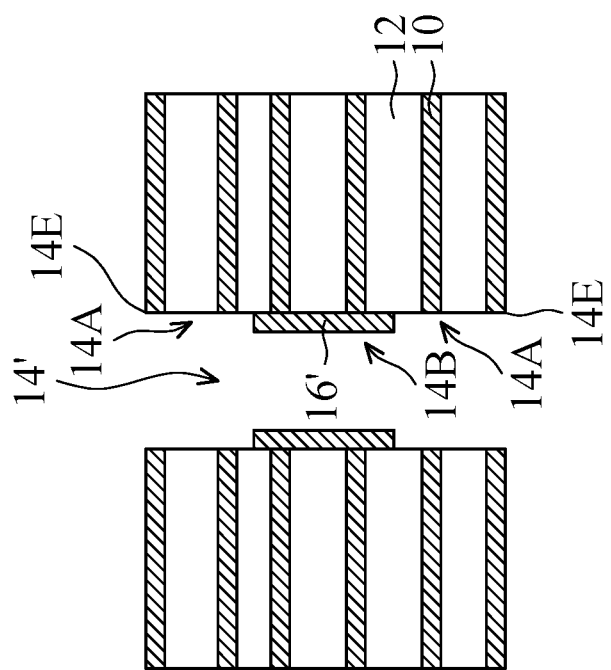

Referring to FIG. 4B, in some embodiments, by extending the electrical discharge machining electrode 104 through the via hole 14 completely, the second region 14B of the vie hole 14' may be sandwiched within the first region 14A. In addition, a portion of the first region 14A is adjacent to the edge 14E between the via hole 14' and the outer surface of the alternate stacking.

Figure 4C:
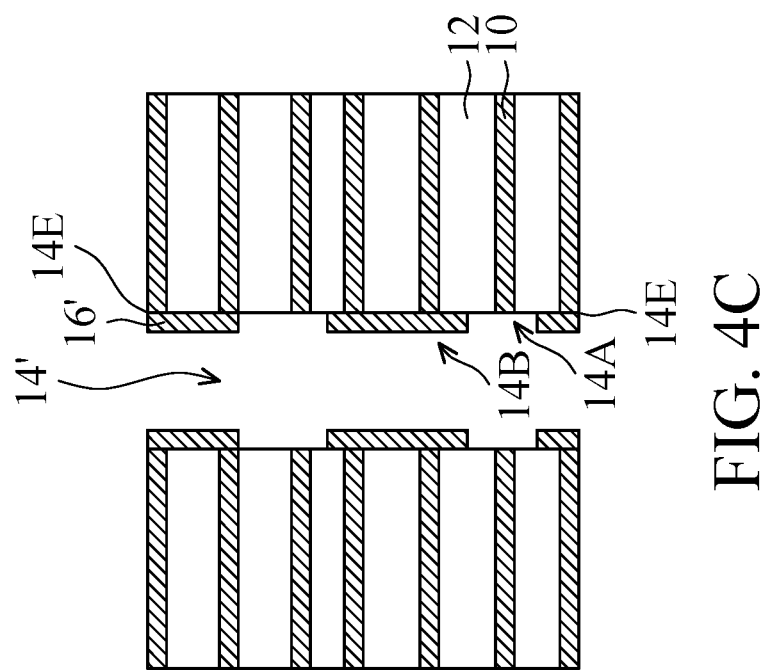

Referring to FIG. 4C, by wrapping the electrical discharge machining electrode 104 with multiple insulating materials 106 spaced apart from each other, the via hole 14' may have multiple portions of the first region 14A separated from the edge 14E of the via hole 14'. Although only the first region 14A separated into two parts is shown in FIG. 4C, the present disclosure does not limit the position of the first region 14A. In fact, in the via hole 14', there may be more parts of the first region 14A and the second region 14B alternately disposed along the longitudinal direction of the via hole 14'.

Figure 4D:
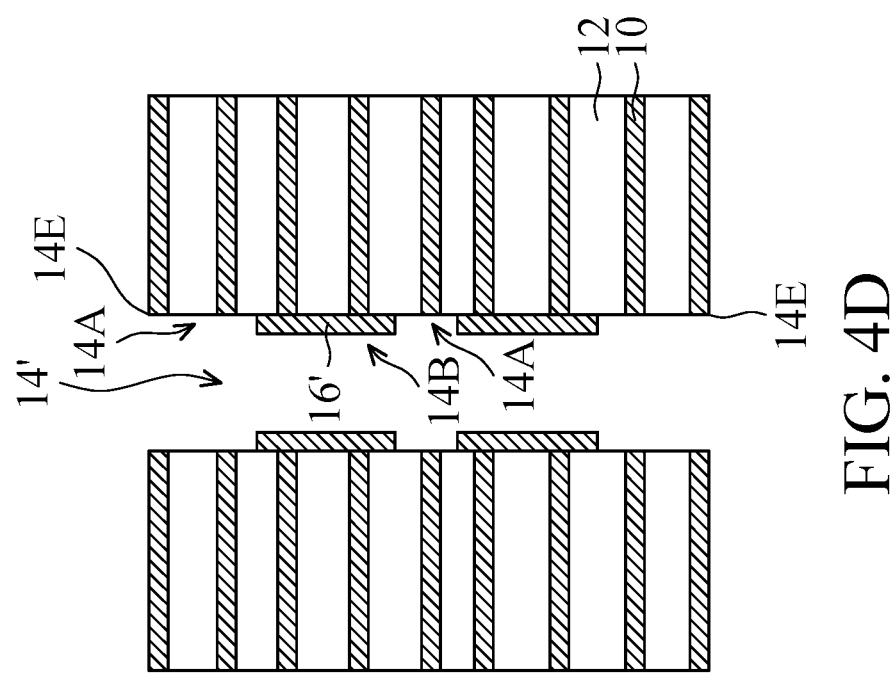

Referring to FIG. 4D, by wrapping the electrical discharge machining electrode 104 with multiple insulating materials 106 spaced apart from each other, the via hole 14' may have multiple portions of the second region 14B separated from the edge 14E of the via hole 14'. Although only the second region 14B separated into two parts is shown in FIG. 4D, the present disclosure does not limit the position of the second region 14B. In fact, in the via hole 14', there may be more parts of the first region 14A and the second region 14B alternately disposed along the longitudinal direction of the via hole 14'.

Figure 5A:
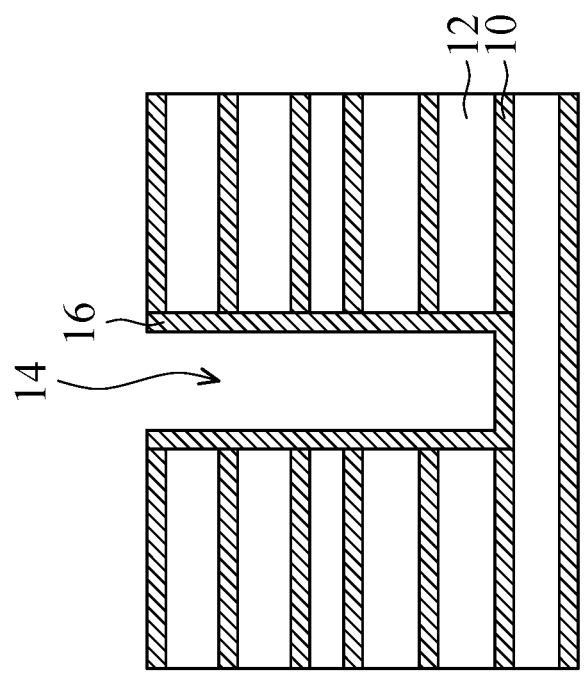
FIGS. 5A-5C illustrate cross-sectional views of various steps of a process of manufacturing a circuit board structure, in accordance with some embodiments of the present disclosure.

Although the via hole 14 included in the circuit board structure 1 of above embodiments is a through hole with two ends communicating, in fact, the via hole 14 may also be a blind via with one end covered by an additional insulating layer 12. Referring to FIG. 5A, one end of the via hole 14 of the circuit board structure 5 is covered by an additional insulating layer 12. Although the conductive layer 16 is disposed on both the sidewall and the bottom of the via hole 14 in FIG. 5A, in some other embodiments, the conductive layer 16 is only disposed on the sidewall of the via hole 14 and exposes the bottom of the via hole 14. In this embodiment, the materials and forming methods of the circuit layers 10, the insulating layers 12, and the conductive layer 16 are similar to those discussed above, and their descriptions are omitted here for simplicity.

Figure 5B:
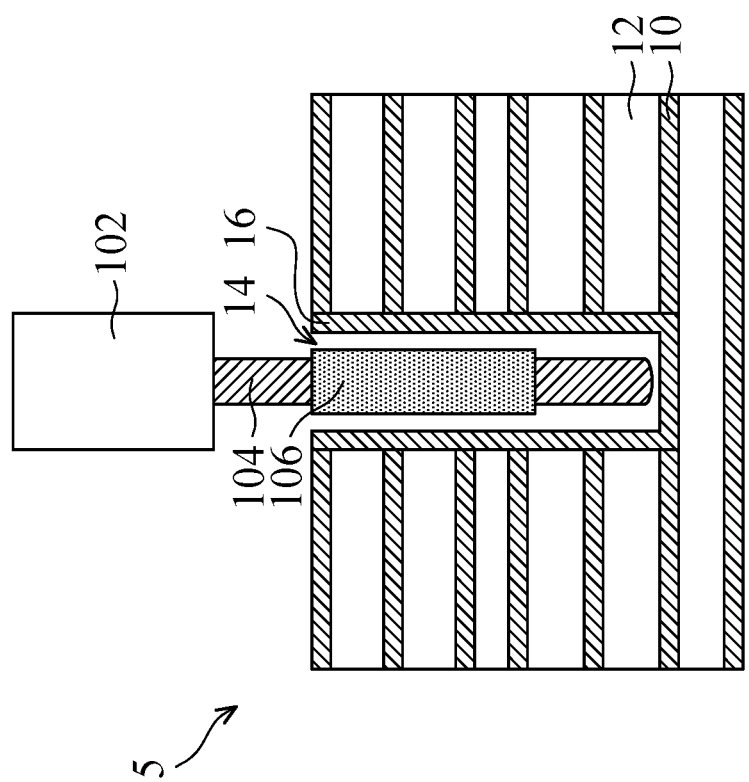
Figure 5C:
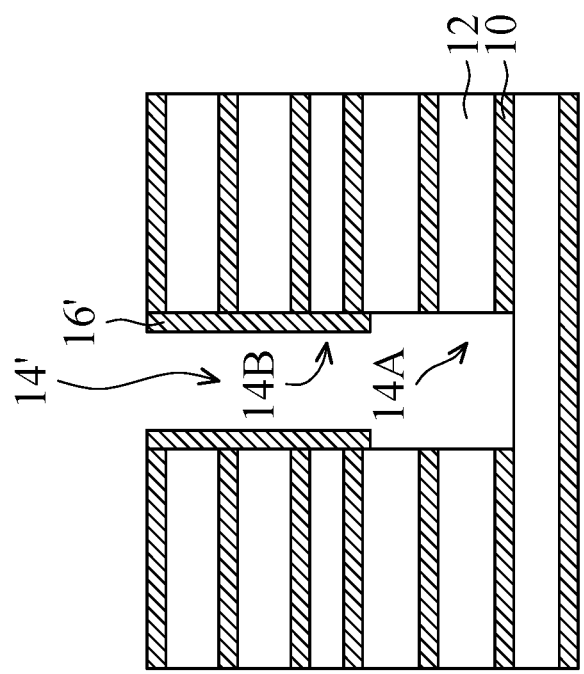

Referring to FIGS. 5B and 5C, an electrical discharge machining step is then performed to remove a portion of the conductive layer 16. In some embodiments, the electrical discharge machining step removes the conductive layer 16 at the bottom of the via hole 14. By wrapping the electrical discharge machining electrode 104 with the insulating material 106 and exposing the end of the electrical discharge machining electrode 104, the remaining conductive layer 16' separated from the upper surface of the substrate may be left within the via hole 14' after the electrical discharge machining step. This is a structure that cannot be fabricated with the conventional via formed by back-drilling techniques.

Even if a back-drill step is performed on the alternate stacking of the circuit layers and the insulating layers 12 and then another alternate stacking is attached to the back-drilled side to form a similar structure, the resulting via hole cannot have a sidewall without misalignment in the radial direction. This is because the diameter of the tool used for the back drilling step must be larger than the original diameter of the via hole. As a result, as shown in FIG. 1, compared to the portion with the remaining conductive layer 16', the via hole after the back-drilling step has an enlarged diameter in the portion where the conductive layer has been removed, so that the sidewall of the via hole will have offsets in the radial direction. In addition, the adhesive in the aforementioned lamination process will diffuse into the resulting via hole, which is difficult to remove when the diameter of the via hole is small, and the adhesive will cover the conductive area in the via hole, affecting the yield of the circuit board structure.

In summary, the present disclosure provides a circuit board structure and a method for forming the circuit board structure by electrical discharge machining. By locally removing the conductive layer in the via hole with an electrical discharge machining step, various advantages can be obtained while avoiding damage to the substrate. For example, when the conductive layer in the via hole is removed, the diameter of the via hole does not increase, thus facilitating the fabrication of higher density circuit layouts. By performing the electrical discharge machining steps, it is possible to form the sidewall of the via hole without misalignment in the radial direction, and to remove the stubs in the via hole at any position to form conductive regions and non-conductive regions within the via hole. In addition, compared with the mechanical machining process, when removing the conductive layer in the via hole by the electrical discharge machining step, it is not needed to consider the problem of alignment deviation, and the opening of the via hole will not be clogged after the electrical discharge machining step. Therefore, through the method for forming a circuit board structure of the present disclosure, a circuit board structure with high-density layout and better yield can be manufactured.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit board structure, comprising:
an alternate stacking of a plurality of circuit layers and a plurality of insulating layers, wherein the alternate stacking does not comprise any plating-resist material;
a via hole penetrating through the plurality of circuit layers and the plurality of insulating layers, wherein lateral ends of the plurality of insulating layers form a sidewall of the via hole, wherein the via hole is a blind via with one end covered by an additional insulating layer; and
a conductive layer conformally disposed within the via hole, exposing a first region of the sidewall and covering a second region of the sidewall, wherein the first region of the sidewall has a first-sub region that is in direct contact with the plurality of circuit layers and a second-sub region that is not in direct contact with the plurality of circuit layers, and a material of the first-sub region is the same as a material of the second-sub region,
wherein the sidewall extends in a longitudinal direction of the via hole and has no misalignments in a radial direction,
wherein the first region and the second region are disposed alternately along the longitudinal direction, and a portion of the first region is sandwiched within the second region,
wherein a diameter of the first region of the sidewall of the via hole is substantially equal to a diameter of the second region of the sidewall of the via hole.

2. The circuit board structure as claimed in claim 1, wherein a portion of the second region is sandwiched within the first region.

3. The circuit board structure as claimed in claim 1, wherein a portion of the second region is adjacent to an edge between the via hole and an outer surface of the alternate stacking.

4. The circuit board structure as claimed in claim 1, wherein the conductive layer is electrically connected to at least some of the plurality of circuit layers.

5. The circuit board structure as claimed in claim 1, wherein a portion of the plurality of circuit layers are exposed at the first region of the sidewall.

* * * * *